US010019977B2

(12) United States Patent
Moeller

(10) Patent No.: US 10,019,977 B2
(45) Date of Patent: Jul. 10, 2018

(54) APPARATUS AND METHOD FOR MOUNTING A SOUND MASKING DEVICE IN A HOTEL ROOM

(71) Applicant: 777388 Ontario Limited, Burlington (CA)

(72) Inventor: Niklas Moeller, Oakville (CA)

(73) Assignee: 777388 Ontario Limited, Burlington (CA)

(*) Notice: Subject to any disclaimer, the term of this patent is extended or adjusted under 35 U.S.C. 154(b) by 0 days.

(21) Appl. No.: 15/198,428

(22) Filed: Jun. 30, 2016

(65) Prior Publication Data
US 2018/0005621 A1  Jan. 4, 2018

(51) Int. Cl.
*H04R 3/02* (2006.01)
*G10K 11/175* (2006.01)
*G06F 3/16* (2006.01)
*H04R 1/02* (2006.01)
*H05K 5/02* (2006.01)

(52) U.S. Cl.
CPC .......... *G10K 11/175* (2013.01); *G06F 3/165* (2013.01); *H04R 1/026* (2013.01); *H05K 5/0204* (2013.01); *H04R 2420/07* (2013.01)

(58) Field of Classification Search
CPC ....... G10K 11/175; G06F 3/165; H04R 1/026; H04R 2420/07; H05K 5/0204
USPC ........................................................ 381/73.1
See application file for complete search history.

(56) References Cited

U.S. PATENT DOCUMENTS

| 4,052,564 | A  | * | 10/1977 | Propst | G10K 11/175 |
|           |    |   |         |        | 181/153 |
| 7,669,817 | B2 |   | 3/2010 | Scott | |
| 2001/0021259 | A1 | * | 9/2001 | Horrall | G10K 11/175 |
|           |    |   |         |        | 381/73.1 |
| 2003/0219133 | A1 | * | 11/2003 | Horrall | G10K 11/175 |
|           |    |   |         |        | 381/73.1 |

(Continued)

FOREIGN PATENT DOCUMENTS

| CA | 2690511 | 9/2004 |
| CA | 2958980 | 3/2016 |
| WO | 2008150320 | 12/2008 |

OTHER PUBLICATIONS

International Search Report and Written Opinion for application No. PCT/CA2017/050794 dated Sep. 30, 2017.

*Primary Examiner* — Quynh Nguyen
(74) *Attorney, Agent, or Firm* — Workman Nydegger

(57) ABSTRACT

An apparatus and method for mounting a sound masking component or device to an existing electronic component, appliance, or a furnishing installed or located in a hotel room or other interior space. According to an embodiment, the existing electronic component or appliance comprises a television set. The television set includes a pre-existing mounting mechanism for attaching a television wall-mounting bracket. The sound masking component further includes a mounting bracket wherein the mounting bracket is configured to be secured to the pre-existing mounting mechanism on the television set. According to another embodiment, the sound masking component is mounted internally inside the television set and configured to receive power from the television power supply and emit a sound masking signal utilizing a television speaker or a separate sound masking speaker.

10 Claims, 6 Drawing Sheets

(56) References Cited

U.S. PATENT DOCUMENTS

| | | | |
|---|---|---|---|
| 2004/0179699 A1* | 9/2004 | Moeller | H04S 3/02 |
| | | | 381/73.1 |
| 2006/0147051 A1 | 7/2006 | Smith et al. | |
| 2006/0261714 A1* | 11/2006 | Hazzard | A47B 81/064 |
| | | | 312/319.8 |
| 2007/0242171 A1* | 10/2007 | Mori | H03G 3/342 |
| | | | 348/794 |
| 2009/0039212 A1* | 2/2009 | Whalen | F16M 11/00 |
| | | | 248/158 |
| 2009/0196455 A1* | 8/2009 | Lee | H04R 1/26 |
| | | | 381/388 |
| 2010/0224751 A1* | 9/2010 | Hochhalter | A47B 81/06 |
| | | | 248/314 |
| 2012/0134519 A1* | 5/2012 | Caldes | H04R 1/02 |
| | | | 381/306 |
| 2012/0219173 A1 | 8/2012 | Yukawa | |
| 2016/0253987 A1* | 9/2016 | Chattell | G10K 11/175 |

* cited by examiner

APPARATUS AND METHOD FOR MOUNTING A SOUND MASKING DEVICE IN A HOTEL ROOM

FIELD OF THE INVENTION

The present invention relates to sound masking systems, and more particularly, to an apparatus and method for mounting a sound masking device or component in a hotel room or other interior space.

BACKGROUND OF THE INVENTION

In the art, installing a sound masking device in a hotel room, or other interior space, presents certain challenges in both new and retrofit installations.

In a new installation, e.g. new construction, unfinished walls and interior coverings provide the flexibility to freely install the sound masking device and the associated cables for power and user control. However, there are still costs associated with the installations.

In a retrofit installation, one or more of the following considerations can be factors. First, the cost of installing physical cabling to connect and/or power the system is much higher given the finished walls and ceilings.

Second, in a hotel application, the speaker component in a sound masking system or device needs to ideally be mounted or installed in the sleeping area for dispersing the sound masking emission and providing effective sound masking for the occupant(s) of the room. This can be problematic in a hotel room. The ceiling is typically not an option as many hotels are constructed with concrete ceilings and floors, and there is no suspended ceiling for installing the sound masking device or speaker component. Similarly, walls may not have sufficient depth or space for installing a sound masking device or speaker component. In addition, installing or running cables and power line or feeds may pose challenges and increased costs for retrofit installations. Even in rooms with bulkheads that run services, there still may not be sufficient space or clearance to run additional cables, power lines and/or install a sound masking device or a speaker component. Furthermore, installing the speaker component on existing furnishings or surfaces is non-trivial for both functional and esthetic considerations.

Third, a retrofit installation requires a power feed which may not always be available for the installation point. Having a free, unused mains outlet, proximate the installation location can be problematic, particularly, in older builds with limited outlets. Adding a new power source, e.g. a mains outlet, can be very expensive. Similarly, installing control cables for the sound masking device and/or speaker component can also be problematic and/or expensive for similar reasons.

For effective user control, the sound masking device controls should be conveniently located for the user, which may not be where the masking device is installed. In a retrofit installation, running the control cabling between the sound masking device, i.e. user control, and the speaker component can require extensive 'fishing' of cables between the components. Often this results in the user control module being installed in a user inconvenient location, e.g. on the wall or other surface beside the speaker component, which could be across the room from a convenient location for the user.

As a result, sound masking devices will not always be installed in the ideal location which results in the sound masking emission not be properly dispersed in the room or the full benefits of sound masking being realized. In other instances, sound masking device installation may not be considered at all due to installation and/or retrofit costs and expenses. Thereby eliminating the benefits of sound masking, particularly, in a potentially noise susceptible environments such as hotel rooms.

Accordingly, there remains a need for improvements in the art.

BRIEF SUMMARY OF THE INVENTION

The present invention is directed to an apparatus and method for mounting a sound masking component or device in a hotel room or other interior space.

According to one embodiment, the present invention comprises a sound masking device configured for mounting on an appliance, on a furnishing or a fixture in a room, the sound masking device comprises: a sound masking component; a mounting mechanism or bracket configured for supporting the sound masking component; and the mounting bracket being further configured to mount to a surface of the furnishing or on or in the appliance or on or in the fixture, out of normal view in the room.

According to another embodiment, the present invention comprises a sound masking device configured for mounting away from visible view in relation to a television set in a room, the sound masking device comprises: a sound masking component; an enclosure configured for supporting the sound masking component; and the enclosure including a mounting mechanism configured to mount the sound masking component to a structural surface adjacent the television set, wherein the structural surface is out of normal view in the room.

According to further embodiment, the present invention comprises a sound masking device configured for mounting to a television set in a room, the sound masking device comprises: a sound masking component; an enclosure configured for housing the sound masking component; and the enclosure being further configured to mount to a surface of the television set.

According to yet another embodiment, the present invention comprises a sound masking device configured for mounting inside a television set located in a room, the sound masking device comprises: a sound masking component configured to generate a sound masking output signal; the sound masking component including a power input for coupling to a power supply of the television set; and the sound masking component including an output for coupling to an output speaker and the speaker being configured to emit the sound masking output signal into the room.

Other aspects and features of the present invention will become apparent to those ordinarily skilled in the art upon review of the following description of embodiments of the invention in conjunction with the accompanying figures.

BRIEF DESCRIPTION OF THE DRAWINGS

Reference will now be made to the accompanying drawings which show, by way of example, embodiments of the present invention, and in which.

Like reference numerals indicate like or corresponding elements or components in the drawings.

DETAILED DESCRIPTION OF THE EMBODIMENTS OF THE INVENTION

Figure 1:
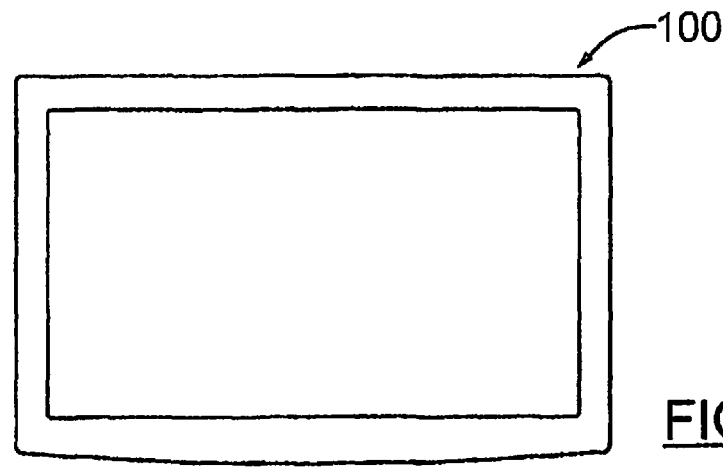
FIG. 1 shows in diagrammatic form an appliance comprising a flat screen television suitable for use with a sound masking device according to an embodiment of the present invention.
Figure 2:
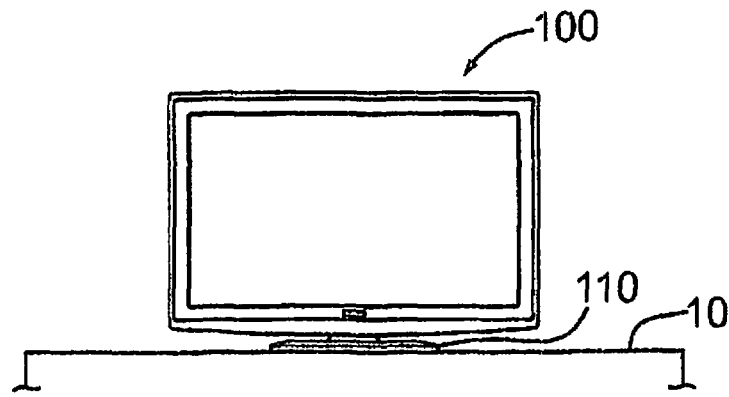
FIG. 2 shows in a diagrammatic form a flat screen television configured with a table-top stand or pedestal.

Reference is first made to FIG. 1, which shows an appliance, i.e. a flat screen television set or TV, suitable for use with or practising embodiments according to the present invention. The flat screen television set or TV is indicated generally by reference 100. The television set 100 can be configured with a table-top stand or pedestal 110 as shown in FIG. 2 for supporting the television 100 on a surface, such as, the top of a cabinet, indicated generally by reference 10. The television set 100 can also be mounted on a surface, e.g. a wall, using a wall-mounting bracket. As will be described in more detail, the present invention comprises embodiments of a sound masking device and mounting brackets or mechanisms and configurations for mounting the sound masking device on the back of a television set, i.e. an appliance, fixture (e.g. a light fixture), or other furnishings, such as those, typically found in a hotel room or the like.

Figure 3:
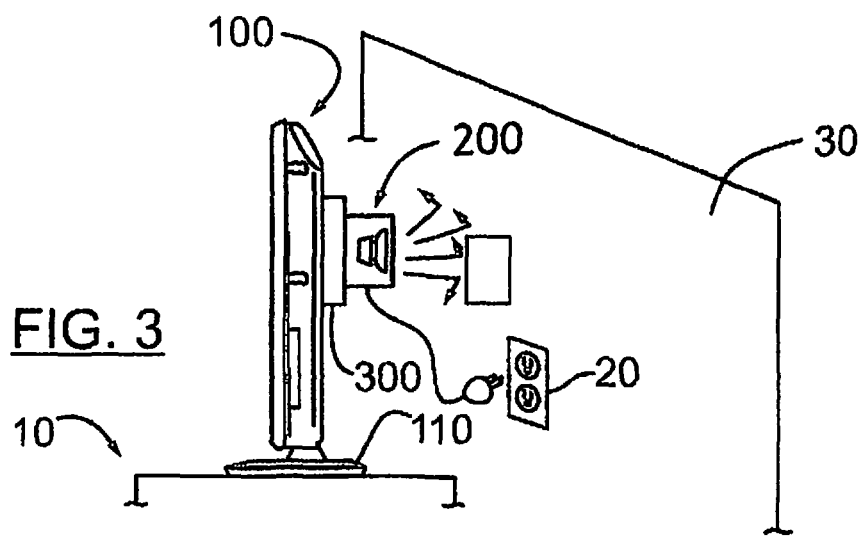
FIG. 3 is a side view of the flat screen television of FIG. 2 with a sound masking component installed according to an embodiment of the present invention.
Figure 4:
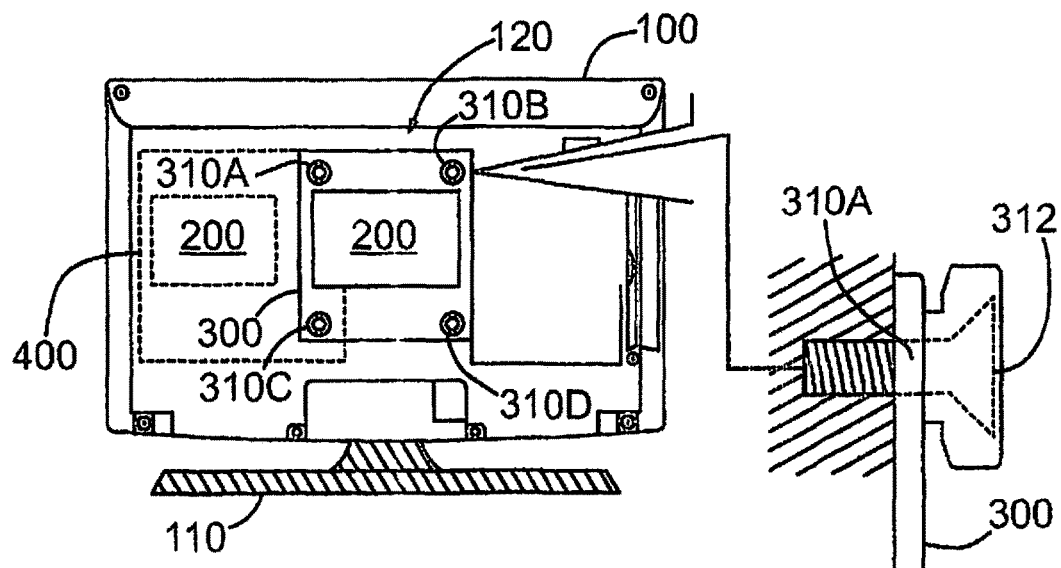
FIG. 4 is a back view of the flat screen television of FIG. 2 showing the wall-hanging bracket installation holes in more detail and the sound masking component installed with a mounting bracket according to an embodiment of the present invention.

According to an embodiment, a sound masking device indicated generally by reference 200 is mounted or secured on the back of the television set 100 with a pedestal stand 110 as shown in FIGS. 3 and 4. As shown, the sound masking device 200 is situated between the back of the television set 100 and a rear wall 30 or surface. According to one aspect, this arrangement provides the capability to utilize the wall 30 (and/or other proximate surfaces) to reflect and disperse the sound masking sound waves emitted from the sound masking device 200 into the room, thereby providing acoustic privacy and/or diminishing noise emanating from inside or outside the rooms. According to another aspect, the sound masking device 200 is conveniently powered utilizing an adjacent mains outlet 20 or a pass-through outlet on the television set 100 (if available).

Figure 5:
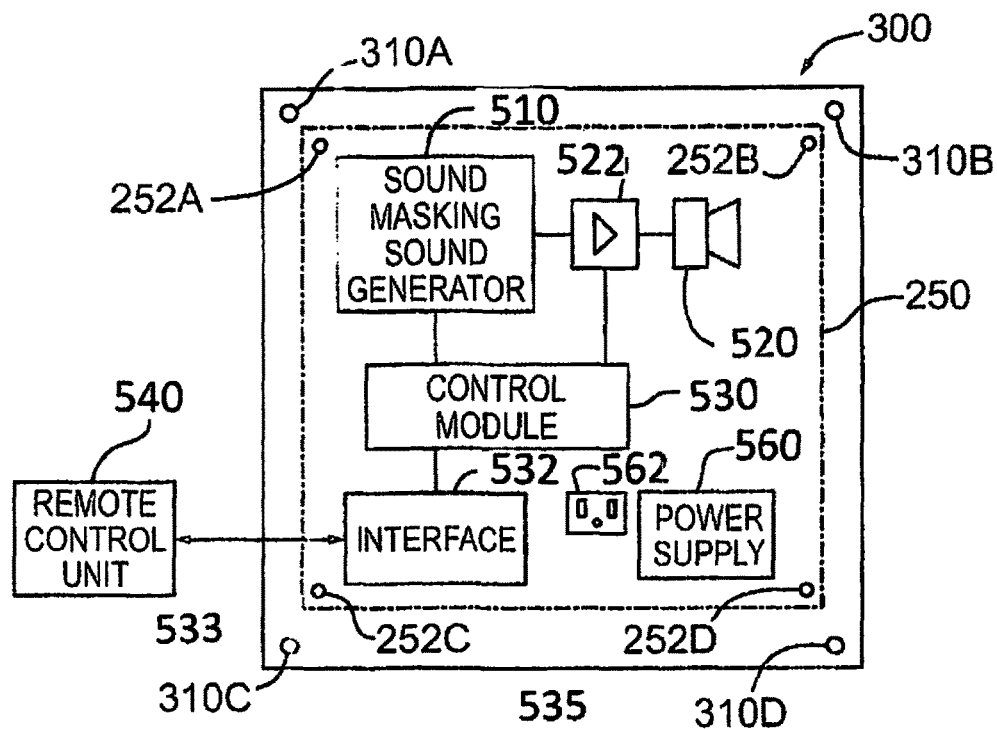
FIG. 5 shows an exemplary implementation of a sound masking system.

According to an exemplary embodiment and as depicted in FIG. 5, the sound masking device 200 comprises a sound masking sound generator 510, a sound masking speaker or speaker component 520 and a control module 530. The control module 530 is operatively coupled to the sound masking sound generator 510 and configured to control the operation and functions associated with the operation of the sound masking device, including sound masking signal(s) generation, sound masking signal output volume level, power on and off, sound masking signal output frequency or spectrum. The sound masking sound generator 510 has an output operatively coupled to the sound masking speaker 520. The sound masking speaker 520 includes an amplifier module 522 configured to increase or decrease the output level, i.e. the volume, of sound masking signal from the sound masking sound generator 510 and emitted by the sound masking speaker 520. According to an exemplary implementation, the control module 530 is configured to generate volume control signals for the amplifier module 522 in response to inputs or settings entered by a user or a technician. According to another exemplary implementation or embodiment, the control module 530 includes a communication interface 532, i.e. a wireless communication interface, for instance implemented using Bluetooth technology or other short distance wireless communication or other wireless signaling protocol, as will be understood by one skilled in the art. The control module 230 is configured is provide the capability for a remote control unit, for example, a tabletop unit, indicated generally by reference 540 to transmit user control inputs or signals, such as, volume up, volume down, power on, power off, and the like. The particular implementation details for the sound masking device 200 will be readily understood by one skilled in the art, for example, as described in U.S. Pat. No. 8,107,639, which issued to the Assignee in common with the subject application, and which is incorporated herein in its entirety by reference.

According to an exemplary implementation, the sound masking device 200 comprises an enclosure or housing indicated generally by reference 250. The enclosure or housing 250 is configured to hold the components comprising the sound masking device 200, i.e. the sound masking sound generator 510, the sound masking speaker 520 and the amplifier module 522, and the control module 530. The enclosure 250 is configured with a grill or other type of opening(s) to facilitate the emission of sound masking sound waves from the sound masking speaker component 520. According to another aspect, the sound making device 200 includes an internal or external DC power supply 560 or a power supply input for connecting to an external power supply, which is plugged into a mains outlet, for example, a plug outlet integrated in the TV or a plug in a mains outlet 20 used to power the television set 100, for example, as illustrated in FIG. 3. According to another aspect, the sound masking device 200 includes a pass-through outlet 562, for example, to power any additional electronic components.

Figure 6A:
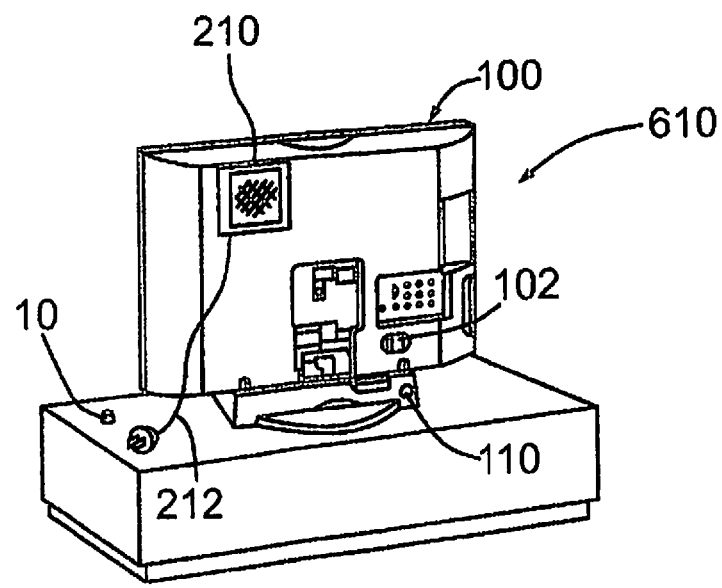
FIG. 6A shows a mounting configuration according to another embodiment of the present invention.
Figure 6B:
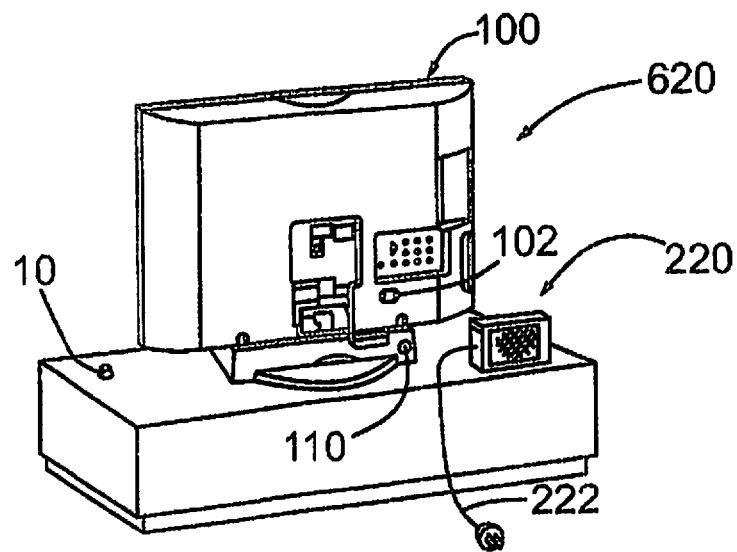
FIG. 6B shows a mounting configuration according to another embodiment of the present invention.
Figure 6C:
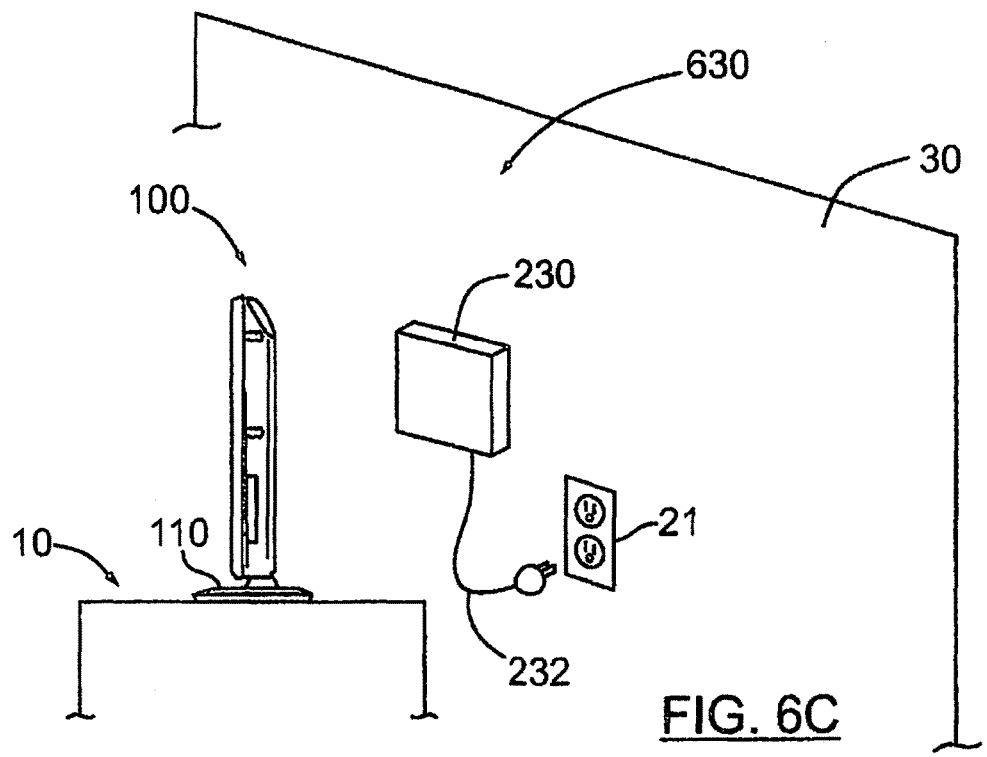
FIG. 6C shows a mounting configuration according to another embodiment of the present invention.
Figure 6D:
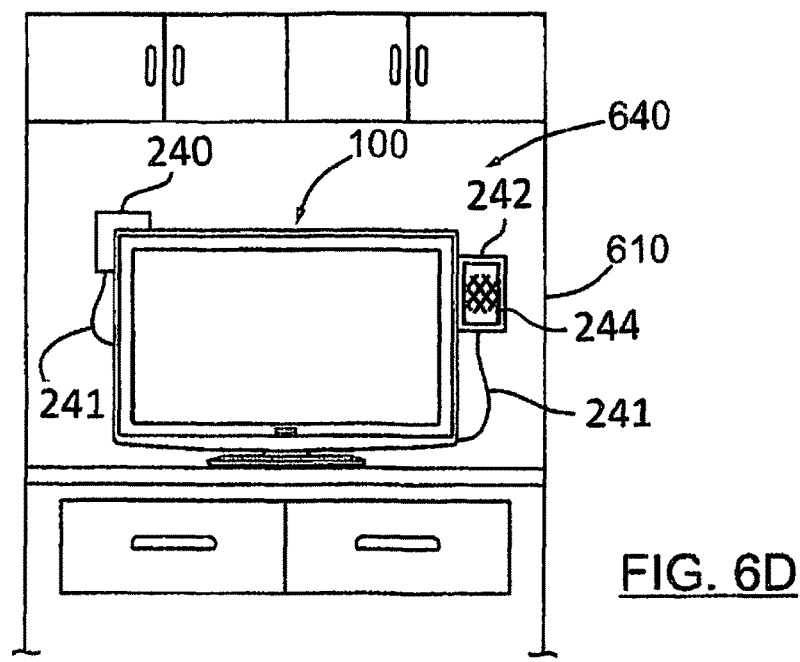
FIG. 6D shows another mounting configuration according to an embodiment of the present invention.

Reference is next made to FIG. 6D, which shows another mounting configuration according to an embodiment of the present invention and indicated generally by reference 640. According to the embodiment, the sound masking device comprises a sound masking generator module 240 and a sound masking speaker module 242. The sound masking generator module 240 comprises a sound masking signal generator, a control module and a communication interface (for example, as described above with reference to FIG. 5) and is configured to generate a sound masking signal output which is fed or inputted by the sound masking speaker module 242, for example, over a cable or hardwired connection indicated by reference 241. The sound masking speaker module 242 is implemented with a speaker and an amplifier (for example as described above). The sound masking generator module 240 and/or the sound masking speaker module 242 can be configured with individual power supplies or a single power supply that powers both modules, plugged into a mains outlet. According to an exemplary implementation, the sound masking speaker module 242 is contained in an enclosure or housing 244 that is attached to the side of the television set 100 mounted inside a cabinet or wall unit 610. The sound masking generator module 240 is mounted completely or partially behind the television set 100, for example as described above.

According to an embodiment of the invention, the sound masking device 200 includes a mounting bracket indicated generally by reference 300, as shown in FIGS. 4 and 5. The mounting bracket 300 is configured to receive and hold or mount the sound masking device 200. The mounting bracket 300 may be constructed from a light weight metal, such as aluminum, or a rigid plastic material, for example. According to an exemplary implementation, the housing or enclosure 250 is attached to the mounting bracket 300 using screws 252, indicated individually by references 252A, 252B, 252C and 252D, in FIG. 5. It will be appreciated that other types of fasteners may be utilized to secure or attach the housing 250 (and sound masking device 200) to the mounting bracket 300.

According to an embodiment, the mounting bracket 300 is configured to be mounted or secured to the back of the television set 100 using a pre-existing mounting mechanism found or installed on the television set 100. According to an embodiment, the mounting bracket 300 is configured to be secured to one or more of the pre-existing mounting holes installed on the back of the television set 100 for attaching a wall-mounting bracket (not shown), indicated generally by reference 120 in FIG. 4. The pre-existing wall-mounting bracket holes 120, i.e. tapped machine screw holes, have a pre-determined spacing and configuration according to industry standard for the manufacture of television sets and compatible wall-mounting brackets. In an exemplary implementation, the wall-mounting bracket holes comprise four machine screw holes spaced 7.9" apart, and the mounting bracket 300 is configured with corresponding mounting holes 310, indicated individually by references 310A, 310B, 310C and 310D. The mounting bracket 300 together with the sound masking device 200 are mounting or secured to the back of the television set 100 using machine screws 312, as depicted in FIG. 4.

Reference is made back to FIG. 3, which shows the sound masking device 200 mounted on the back of the television set 100 between the television set 100 and a wall, indicated generally by reference 30. According to another aspect, the sound masking speaker 220 is mounted inside the sound masking device enclosure or housing 250 to face the wall 30. This configuration utilizes the wall 30 to reflect and disperse the sound masking sound wave(s) emitted by the speaker 220 outwards and into the space of the hotel room.

According to another embodiment, the sound masking device 200 is attached to a mounting bracket which is offset from the wall-mounting bracket holes 120, as shown in broken outline in FIG. 4 and indicated generally by reference 400. As shown, the mounting bracket 400 is offset and secured utilizing the two mounting holes 310A and 310C. It will be appreciated that the offset mounting bracket 400 is suitable for installations wherein the television set 100 is mounted using a wall-mounting bracket (not shown). It will also be appreciated that for confined spaces, such as mounting with a wall-mounting bracket in place, the dimensions and profile of the sound masking device 200 and enclosure 250, and/or the speaker component 220 will need to be configured to fit between the television set 100 and the rear wall or mounting surface 30 for the wall bracket.

According to another embodiment, the sound masking device 200 is configured and installed with the sound masking speaker 220 (and amplifier module 222) separately mounted on the back of the television set 100 utilizing a mounting bracket 300 (or 400) as described above. The sound masking sound generator 210 and control module 230 are located remotely from the speaker component 220 and operatively coupled through a cable or a wireless link. The particular implementation details of the hardwired or wireless link will be readily within the understanding of one skilled in the art.

While the sound masking device 200 and the mounting brackets 300, 400 are described in the context of a television installation above, it will be appreciated that the mounting brackets 300, 400 may be utilized to mount or install the sound masking device 200 on the rear or underside of other furnishings or furniture pieces or fixtures or other appliances normally found in a hotel room. For instance, the sound masking device 200 can be mounted on the back of a cabinet or dresser, or underneath a table or desk or hidden by a lamp shade.

Reference is next made to FIG. 6A, which shows a mounting configuration according to another embodiment of the present invention and indicated generally by reference 610. As shown in FIG. 6A, a sound masking generator indicated by reference 210 is attached to a rear surface of the television set 100 outside of the pre-existing mounting mechanism, for example, double side tape or other suitable adhesive or fastener(s). The sound masking generator 210 includes a power cord 212 which may be plugged into a mains outlet, for example, the outlet 20 as depicted in FIG. 3. In the alternative, if the television 100 is equipped with an auxiliary outlet 102, the sound masking generator 210 may be powered using the auxiliary outlet 102.

Reference is made to FIG. 6B, which shows a mounting configuration according to another embodiment and indicated generally by reference 620. According to the embodiment, a sound masking generator indicated generally by reference 220 is mounted or positioned on the cabinet 10, or other piece of furniture, for example, a TV stand. According to an exemplary implementation, the sound masking generator 220 is AC mains or line powered and includes a power cord 222 which is plugged into the wall outlet 20 (FIG. 3) or the auxiliary outlet 102 available on the television set 100.

Reference is next made to FIG. 6C, which shows another mounting configuration according to an embodiment of the present invention and indicated generally by reference 630. According to this embodiment, a sound masking generator 230 is configured behind the television set 100, i.e. out of normal sight or the viewing angle of an occupant, and attached to the wall 30 using suitable fasteners, for example, screw or mechanical type fasteners, double sided or other adhesive type fasteners. The sound masking generator 230 is AC mains or line powered and includes a power cord 232 which is plugged into an AC outlet 21 on the wall 30.

Figure 7A:
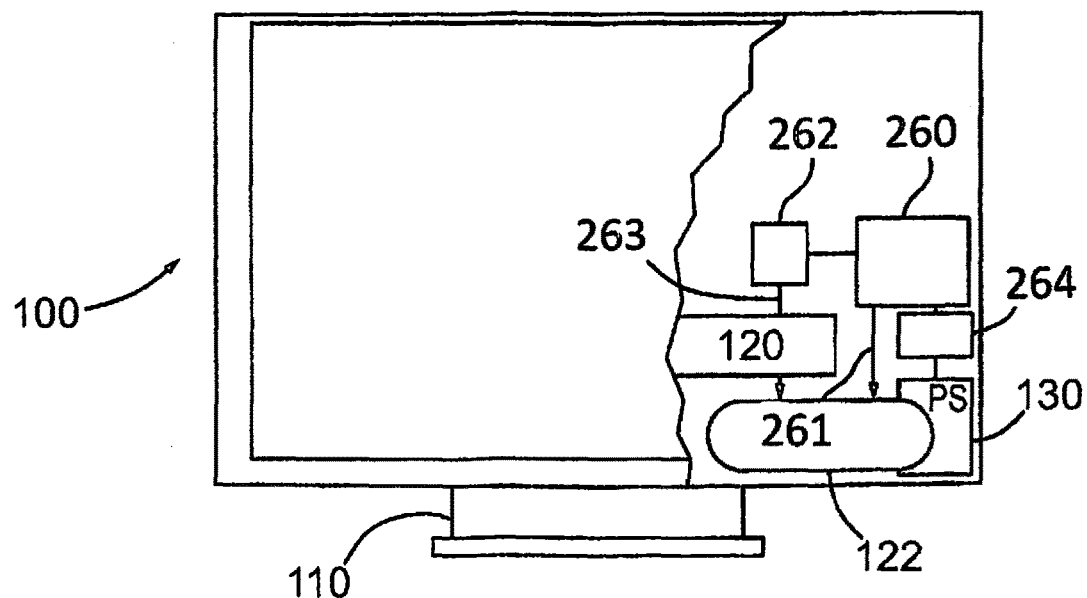
FIG. 7A shows a sound masking component configured to be installed internally in television set according to an embodiment of the present invention.
Figure 7B:
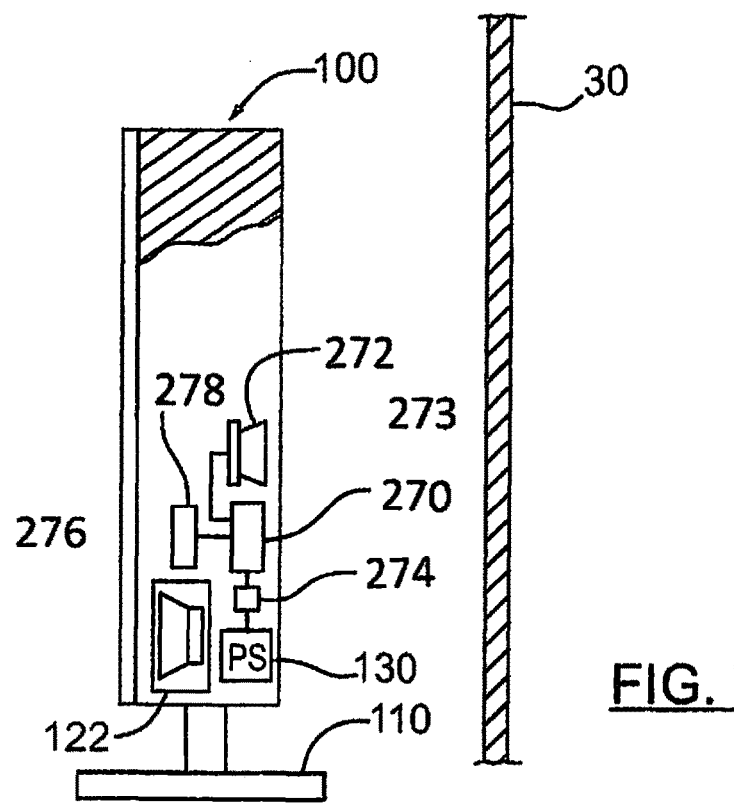
FIG. 7B shows a sound masking component configured to be installed internally in television set according to another embodiment of the present invention.

Reference is next made to FIGS. 7A and 7B, which shows embodiments of a sound masking generator integrated or built-in to the television set 100, i.e. the appliance, according to the present invention.

FIG. 7A shows a sound masking generator mounted internally and integrated with the television set 100 and configured to use one or more existing television speakers according to an embodiment of the present invention. As shown in FIG. 7A, the television set 100 is configured with internal electronic circuitry indicated generally by reference 120, a speaker or speaker array indicated generally by reference 122 and a power supply, for example, a DC power supply indicated generally by reference 130. The sound masking generator is indicated generally by reference 250 and is housed or mounted inside the television set housing or chassis and operatively coupled to the power supply 130. According to an embodiment, the sound masking generator 250 is coupled to the power supply 130 through a power supply feed module 254. According to an exemplary implementation, the power supply feed module 254 is configured to provide power to the sound masking generator 250 (and the speaker array 122) when the television is turned off or in a sleep mode, as described in more detail below. The sound masking generator 250 may also include a remote receiver control module indicated generally by reference 252. According to an exemplary implementation, the remote receiver control module 252 is configured to receive sound masking control signals from a remote device, e.g. an infrared handheld remote, a Bluetooth enabled remote device or an app installed on a Bluetooth enabled smartphone. The sound masking control signals may include volume control, sound masking output frequency control, and/or timer control functions. According to another embodiment, the remote receiver control module 252 is integrated or coupled with the television remote control receiver module in the electronic circuitry 120 of the television set 100. In accordance with this embodiment, the sound masking functions can also be integrated with or built into a television remote, for example, as depicted in FIG. 7C, and indicated generally by reference 700.

Figure 7C:
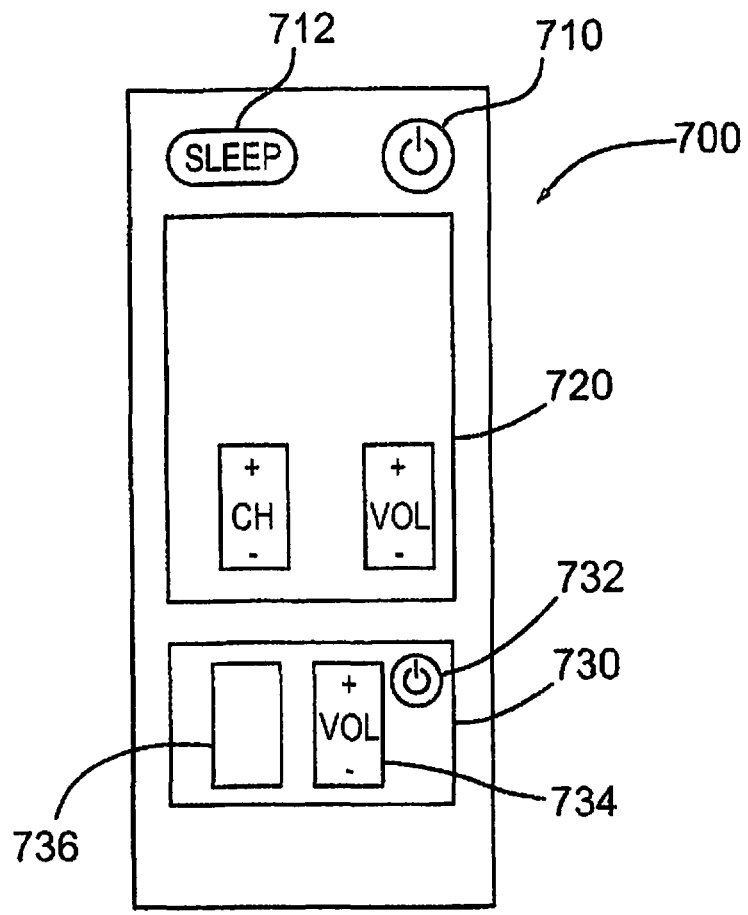
FIG. 7C shows a remote control configured for use with the sound masking component of FIGS. 7A and 7B.

Referring to FIG. 7C, the exemplary television remote 700 comprises a power on/off button 710, an array of television control function control buttons indicated generally by reference 720 and a sound masking control panel or control button array indicated generally by reference 730. The television remote may also include a "SLEEP" button 712. According to an exemplary implementation, the sound masking controls 730 include a sound masking on/off button 732, a sound masking volume up/down button 734, and a sound masking output sound signal control button 736.

In operation and according to an exemplary implementation, the sound masking generator 250 is configured to generate a sound masking signal which is fed to and outputted by the television speaker array 122 into the hotel room. According to an exemplary implementation, the sound masking generator 250 is configured to output the sound masking signal when the television set is off or in sleep mode in order to maintain the fidelity of the sound signals being generated and also fed in the speaker array 122 when a user has turned on the set 100 and is watching a program. According to another aspect, the sound masking generator 250 may be configured to always be on and the sound masking output signal and the television audio output signals would be fed to the speaker array 122 and effectively mixed. The sound masking volume up/down button 734 may be used to control the volume of the sound masking signal emitted by the speaker array 122 independently of the volume of the audio signal being emitted for the television. According to another aspect, the sound masking generator 250 may be configured to allow the user to selectively turn on and off the sound masking function, for example, using the sound masking on/off button 732 on the remote device 700 (FIG. 7C) and/or control the volume of the sound masking output. According to another exemplary implementation, the sound masking generator 250 is configured to automatically turn on when the television set 100 is put into sleep mode.

Reference is next made to FIG. 7B, which shows a sound masking generator 260 according to another embodiment of the present invention. In FIG. 7B, the television set 100 is depicted in a side and cutaway view showing a partial view of the inside of the television set. The sound masking generator 260 is configured in a similar fashion to the sound masking generator 250 of FIG. 7A as described above. The sound masking generator 260 is operatively coupled to the television power supply, i.e. the internal DC power supply 130. In contrast to the embodiment shown in FIG. 7A, the sound masking generator 260 is configured to operate with a dedicated or independent speaker indicated by reference 266 in FIG. 7B. The implementation of sound masking module 260 may include a power supply feed module 264, which is configured to provide power to the sound masking generator 260 and the sound masking speaker 266 when the television is turned off or in a sleep mode, for example, in a manner similar to that described above. The sound masking module 260 may also be coupled to a remote receiver control module indicated generally by reference 262, which is implemented and operates in a manner similar to the remote receiver control module 252, as described above with reference to FIG. 7A.

As shown in FIG. 7B, the sound masking speaker 266 is mounted or configured in a rear facing orientation or position. According to an exemplary implementation, the rear of the television set 100 includes openings or a grill indicated generally by reference 268. The speaker grill 268 is configured to facilitate the propagation of the sound masking signal emitted by the speaker 266 from the rear of the television set 100, and further dispersal of the sound masking signal reflecting off the adjacent surface 30, e.g. wall or cabinet enclosure.

In operation and according to an exemplary implementation, the sound masking generator 260 is configured to generate a sound masking signal which is fed to and outputted by the sound masking speaker 266. According to an exemplary implementation, the sound masking generator 260 is configured to output the sound masking signal when the television set is off or in sleep mode, for example, through operation of the power supply feed module 264. According to another aspect, the sound masking generator 260 may be configured to allow the user to selectively turn on and off the sound masking function, for example, using the sound masking on/off button 732 on the remote device 700 (FIG. 7C) and/or control the volume of the sound masking output. According to another exemplary implementation, the sound masking generator 260 is configured to automatically turn on when the television set 100 is put into sleep mode.

The particular technical implementation details of the television set components and electronics, and the specific connections and implementation particulars for internally mounting the sound masking component, configuring the sound masking control and operational functions in conjunction with the television electronics and components will be within the understanding of those skilled in the art.

The present invention may be embodied in other specific forms without departing from the spirit or essential characteristics thereof. Certain adaptations and modifications of the invention will be obvious to those skilled in the art. Therefore, the presently discussed embodiments are considered to be illustrative and not restrictive, the scope of the invention being indicated by the appended claims rather than the foregoing description, and all changes which come within the meaning and range of equivalency of the claims are therefore intended to be embraced therein.

What is claimed is:

1. A sound masking device suitable mounting on a rear surface of a television set installed in a hotel room, said sound masking device comprising:
   a sound masking component;
   a mounting bracket configured for attaching and supporting said sound masking component;
   the television set having a rear surface and including a wall mounting mechanism for attaching a television wall mounting bracket, the wall mounting mechanism comprising a plurality of wall mounting bracket holes according to an industry standard;
   said mounting bracket comprising a plurality of mounting holes, and said plurality of mounting holes having a spacing and configuration with at least one of said plurality of mounting holes is aligned with at least one of said plurality of wall mounting bracket holes, so that said sound masking component is mountable on the rear surface of the television without modification; and
   said sound masking component comprising an enclosure, said enclosure having a profile configured to allow said sound masking component to fit between the rear surface of the television and a surface adjacent the rear surface of the television set and out of normal view of any occupant in the hotel room.

2. The sound masking device as claimed in claim 1, further including a speaker mounted in said enclosure, and said enclosure including an opening for emission of sound masking sound waves from said speaker, and said opening being configured in a rear-facing direction to facilitate reflection of said sound masking sound waves by the rear surface and dispersion of said sound masking sound waves in the hotel room.

3. The sound masking device as claimed in claim 2, wherein said speaker comprises a rear facing speaker.

4. The sound masking device as claimed in claim 2, wherein the wall mounting mechanism comprises four wall mounting bracket holes, and said mounting bracket comprises four mounting holes, and said mounting bracket being configured to be mounted in a first mounting position with each of said four mounting holes being aligned with a respective wall mounting bracket holes, and said mounting bracket being configured to be mounted in an offset mounting position, in said offset mounting position two of said four mounting holes being aligned with two of said four wall mounting bracket holes.

5. The sound masking device as claimed in claim 4, wherein in said offset mounting position, said sound masking component being mounted adjacent the television wall mounting bracket.

6. The sound masking device as claimed in claim 5, wherein the rear surface comprises a wall in the hotel room, and the television is secured to the wall with the television wall mounting bracket.

7. A sound masking device configured for mounting internally in a television set located in a hotel room, said sound masking device comprising:
   a sound masking generator configured to generate a sound masking output signal;
   said sound masking generator including a power supply input;
   said sound masking generator including an output for coupling to an output speaker, said output speaker comprising a rear-facing speaker and being configured to emit the sound masking output signal from the rear of the television in a rearward direction to facilitate reflection of said sound masking sound waves by a surface adjacent the rear of the television so that the sound masking output signal is dispersed in the hotel room; and
   a power supply feed module, said power supply feed module comprising a power supply output coupled to said power supply input, and said power supply feed module being operatively coupled to a power supply in the television set and configured to provide a power feed to said power supply output independent of whether the television set is turned on.

8. The sound masking device as claimed in claim 7, wherein said power supply feed module is configured to turn off said sound masking generator when the television set is turned on.

9. The sound masking device as claimed in claim 7, wherein said power supply feed module is configured to turn on said sound masking generator when the television set is turned off or put into sleep mode.

10. The sound masking device as claimed in claim 9, further including a remote receiver control module, said remote receiver control module being configured to receive one or more control signals from a remote control device, wherein said sound masking generator is configured to be responsive to said one or more control signals.

* * * * *